(12) United States Patent
Garandet et al.

(10) Patent No.: US 9,145,339 B2
(45) Date of Patent: Sep. 29, 2015

(54) MATERIAL HAVING A MULTILAYER ARCHITECTURE AND INTENDED FOR BEING CONTACTED WITH LIQUID SILICON

(75) Inventors: Jean-Paul Garandet, Grenoble (FR); Denis Camel, Chambery (FR); Béatrice Drevet, Grenoble (FR); Nicolas Eustathopoulos, Grenoble (FR); Rana Israel, Grenoble (FR)

(73) Assignees: Commissariat a l'Energie Atomique et Energies Alternatives, Paris (FR); Center National de la Recherche Scientifique, Paris (FR)

( * ) Notice: Subject to any disclaimer, the term of this patent is extended or adjusted under 35 U.S.C. 154(b) by 964 days.

(21) Appl. No.: 13/062,472

(22) PCT Filed: Sep. 3, 2009

(86) PCT No.: PCT/FR2009/051668
§ 371 (c)(1),
(2), (4) Date: Oct. 31, 2011

(87) PCT Pub. No.: WO2010/026344
PCT Pub. Date: Mar. 11, 2010

(65) Prior Publication Data
US 2012/0040139 A1 Feb. 16, 2012

(30) Foreign Application Priority Data

Sep. 5, 2008 (FR) ...................... 08 55972

(51) Int. Cl.
*B32B 3/26* (2006.01)
*C04B 35/573* (2006.01)
(Continued)

(52) U.S. Cl.
CPC ............ *C04B 35/573* (2013.01); *C04B 35/806* (2013.01); *C04B 41/009* (2013.01);
(Continued)

(58) Field of Classification Search
CPC ............ Y10T 428/249967; Y10T 428/24996; Y10T 428/249961; Y10T 428/249969; Y10T 428/249974; C04B 41/009; C04B 41/87; C04B 41/5059; C04B 41/4517; C04B 41/4523; C04B 41/4556; C04B 38/00; C04B 2235/422; C04B 2235/425; C04B 2235/5436; C04B 2235/656; C04B 2235/6565; C04B 2235/6567; C04B 2235/662; C04B 2235/728; C04B 2235/77; C04B 2235/95; C30B 11/002; C30B 29/06; C30B 35/002
USPC ......... 428/161, 162, 164, 172, 212, 697, 698, 428/699
See application file for complete search history.

(56) References Cited

U.S. PATENT DOCUMENTS 3,925,577 A   12/1975   Fatzer et al.
4,299,881 A   11/1981   Luhleich et al.
(Continued)

FOREIGN PATENT DOCUMENTS

EP   0 228 166 A1   7/1987
EP   0 409 983 A1   1/1991
(Continued)

OTHER PUBLICATIONS

International Preliminary Report on Patentability dated Apr. 5, 2011 issued in PCT/FR2009/051668.
(Continued)

*Primary Examiner* — Donald J Loney
(74) *Attorney, Agent, or Firm* — Scully, Scott, Murphy & Presser

(57) ABSTRACT

The present invention relates to novel materials intended for being contacted with liquid silicon and having a multilayer architecture, the intermediate layer of which is formed by a silicon carbide matrix containing at least one carbon nodule. The invention also relates to the method for preparing said materials.

22 Claims, 2 Drawing Sheets

(51) Int. Cl.
*C04B 35/80* (2006.01)
*C04B 41/00* (2006.01)
*C04B 41/50* (2006.01)
*C04B 41/87* (2006.01)
*C30B 11/00* (2006.01)
*C30B 29/06* (2006.01)
*C30B 35/00* (2006.01)

(52) U.S. Cl.
CPC ............. *C04B41/5059* (2013.01); *C04B 41/87* (2013.01); *C30B 11/002* (2013.01); *C30B 29/06* (2013.01); *C30B 35/002* (2013.01); *C04B 2235/422* (2013.01); *C04B 2235/425* (2013.01); *C04B 2235/5436* (2013.01); *C04B 2235/656* (2013.01); *C04B 2235/6565* (2013.01); *C04B 2235/6567* (2013.01); *C04B 2235/662* (2013.01); *C04B 2235/728* (2013.01); *C04B 2235/77* (2013.01); *C04B 2235/95* (2013.01); *Y10T 428/24521* (2015.01); *Y10T 428/24996* (2015.04); *Y10T 428/249967* (2015.04); *Y10T 428/249969* (2015.04); *Y10T 428/249974* (2015.04)

(56) References Cited

U.S. PATENT DOCUMENTS

| | | | |
|---|---|---|---|
| 5,236,638 A | | 8/1993 | Schulten et al. |
| 5,968,653 A | * | 10/1999 | Coppella et al. ............. 428/408 |
| 2008/0241475 A1 | | 10/2008 | Fukuoka et al. |

FOREIGN PATENT DOCUMENTS

| | | |
|---|---|---|
| FR | 2 068 160 A | 8/1971 |
| FR | 2 207 883 A | 6/1974 |
| FR | 2 387 923 A | 11/1978 |
| GB | 1 328 250 | 8/1973 |
| JP | 2005-281085 A | 10/2005 |
| RU | 2 194 683 C2 | 12/2002 |

OTHER PUBLICATIONS

Japanese Office Action dated Jun. 5, 2013 issued in JP 2011-525599.
Japanese Office Action dated Jul. 26, 2012 issued in JP 2011-525599.
Chinese Office Action dated Oct. 23, 2012 issued in CN 200980134949.8.
Korean Office Action dated May 29, 2013 issued in KR 10-2011-7007594.
Russian Office Action issued in RU 2011107881/03(011241).
International Search Report dated Oct. 15, 2010.

* cited by examiner

Avant siliciuration

Après siliciuration

MATERIAL HAVING A MULTILAYER ARCHITECTURE AND INTENDED FOR BEING CONTACTED WITH LIQUID SILICON

The present invention aims to provide novel materials that can be used in silicon fusion and solidification processes and notably dedicated to photovoltaic applications. It moreover relates to a method for preparing these materials.

Photovoltaic cells are essentially produced from mono- or poly-crystalline silicon obtained from the solidification of liquid silicon in crucibles. These are wafers cut from the ingot formed in the crucible and serve as a basis for the production of cells.

The ingot is generally grown in silica crucibles coated with a layer of silicon nitride in order to prevent the ingot adhering to the crucible following solidification. Unfortunately, this type of silica crucible cannot be reused.

This problem is particularly overcome by the use of a graphite crucible.

Such crucibles are notably used in the fusion of silicon in methods for the purification of metallurgical silicon. When liquid silicon is put into contact with graphite, a layer of silicon carbide forms by reaction at the interface. The reaction continues until a sealing barrier layer is inserted between the carbonaceous material and liquid silicon. In the mean time, silicon infiltrates the carbonaceous matrix to a depth that depends mainly on the porosity of this matrix. For example, in materials of the extruded graphite type, a depth of the order of a centimeter are often obtained, while they are of the order of millimeters for fine grain graphites. On the other hand, for vitreous carbon, no notable infiltration is observed, only the barrier layer forming by reaction at the interface.

It is also possible to siliconize in the vapor phase. For example, the Toyotanso Company markets graphite coated with SiC by the CVD technique under the trade name Perma Kote® (3). SiC thicknesses may be relatively large, of the order of 100 μm, but the layer is never perfectly dense and may present sealing problems. Thus, infiltration of silicon into the porosities and contact with unreacted graphite may destroy the carbide layer on account of the volume change associated with siliconization reactions.

In fact, whatever the technique selected for forming the SiC layer on the surface of the graphite crucible, the protection ensured by the SiC barrier layer is not durable. Two mechanisms contribute to the consumption of the layer. For parts in contact with molten silicon, the system has the tendency to change toward an equilibrium state where the liquid is saturated with carbon by dissolution of the SiC layer. For parts in contact with an oxidizing atmosphere, oxidation of SiC will also have the effect of reducing the thickness of the layer.

Consequently, although these crucibles are certainly reusable as compared with silica crucibles, they still have a limited life.

The object of the present invention is to provide a novel composite structure of silicon carbide and graphite, making it possible to increase significantly the life of materials designed to be brought to very high temperatures, just like crucibles intended to receive molten silicon.

Thus, the object of the present invention is also to provide a novel type of crucible that can be reused.

The object of the present invention is in particular to provide a novel type of crucible that is particularly advantageous in terms of the non-adhesion of silicon.

The object of the present invention is moreover to provide a preparative method useful for preparing such parts.

More precisely, the present invention relates, according to one of its features, to a material part, notably intended to be put into contact with liquid silicon, possessing a monolayer architecture formed of at least one layer called the "support layer" based on carbon, a layer called the "surface layer" made of silicon carbide, and a layer called the "intermediate layer" inserted between said support and surface layers, characterized in that said intermediate layer is formed of a matrix of silicon carbide containing at least one carbon nodule.

Advantageously, the surface and intermediate layers possess less than 5%, notably less than 1% by volume of solid silicon, and in particular are totally devoid of solid silicon.

As regards the intermediate layer, this is characterized by homogeneity in terms of the composition throughout all its thickness.

More particularly, the silicon carbide matrix forming the intermediate layer contains at least 30% by volume, in particular at least 40% by volume, of a carbon nodule or nodules advantageously distributed uniformly throughout the thickness of the intermediate layer.

As stated hereinafter, this intermediate layer possesses a volume fraction of SiC at least 1.8 times higher than the volume fraction of the graphite porosity of the layer called the carbon-based support layer, representing the composition of the original surface of the material before treatment according to the invention.

According to an advantageous embodiment, the material part according to the invention possesses a surface layer of silicon carbide possessing a thickness of at least 5 μm, notably varying from 15 μm to 20 μm.

Advantageously, the material part according to the invention possesses an intermediate layer possessing a thickness of at least 300 μm, in particular greater than 400 μm, and notably varying from 500 μm to 2000 μm.

According to a preferred embodiment of the invention, the material part is a crucible or a mold, intended notably to be put into contact with a material brought to a very high temperature, such as for example liquid silicon.

It may also consist of a part of a mold or crucible that, by assembly with one or more other parts, precisely enables said crucible or mold to be formed.

Crucibles according to the invention prove to be better adapted than their graphite homologs in several ways.

First of all they are multi-use.

Moreover, for fusion processes their composite structure gives them significantly improved resistance to liquid silicon and oxidation in as much as the thickness of the intermediate layer is much greater than the usual dimensions.

In addition, the chemical protection of silicon against impurities contained in graphite is also found to be improved.

Finally, for solidification processes, the anti-adhesion resistance of the $Si_3N_4$ layer is better on an SiC substrate than on a graphite substrate, since it is possible to anneal the nitride anti-adhesion deposit at a high temperature.

Advantageously, the material parts according to the invention are in this way compatible with use at a temperature that may extend as far as 1600° C.

According to another of its features, the object of the present invention is to provide a method for preparing a material part possessing a multilayer architecture composed of at least one layer called the "support layer" based on carbon, a layer called the "surface layer" made of silicon carbide and a layer called the "intermediate layer" inserted between the two preceding layers and formed of at least one silicon carbide matrix containing at least one carbon nodule, said method comprising at least steps consisting of:

(1) making use of a material part comprising at least one external carbonaceous layer with a volume porosity varying from 25% to 40%, preferably 30% to 35%, preferably extending over a thickness of at least 1000 µm, (2) putting said part into contact with liquid silicon, (3) holding the assembly at a temperature favorable to the infiltration of said liquid silicon into the pores of the carbonaceous layer and to the formation of a composite zone formed of a graphite matrix incorporating SiC nodules, and (4) bringing the part obtained at the end of the preceding step to a temperature between 1500° C. and 1700° C., preferably from 1500° C. to 1600° C., in order to form said anticipated surface and intermediate layers and notably such as defined above and to consume the essential part of residual silicon from the preceding step.

According to a preferred embodiment of the invention, the temperature of step (3) may be advantageously adjusted between the melting point of silicon, namely approximately 1410° C. to approximately 1500° C., advantageously from approximately 1410° C. to approximately 1450° C.

Other features and advantages of the invention will become better apparent on reading the following description, given as a non-limiting illustration with reference to the appended figures, in which.

Figure 1A:
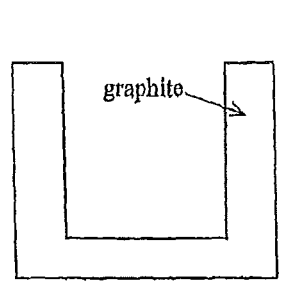
FIGS. 1a and 1b are schematic representations in cross section of a crucible before and after treatment by a method according to the invention.
Figure 1B:
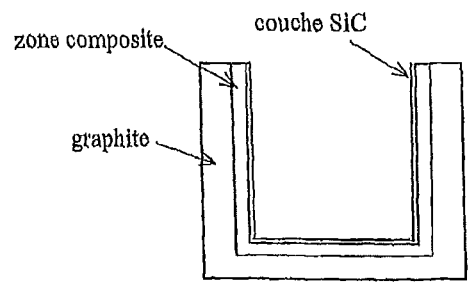
Figure 2:
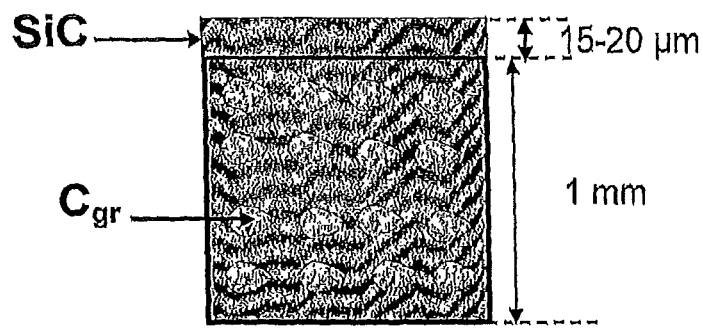
FIG. 2 is a schematic representation in cross section of a detail of the inner part of a crucible according to the invention and on which a surface layer of SiC is represented as well as the structure of the composite zone forming the intermediate layer.
Figure 3:
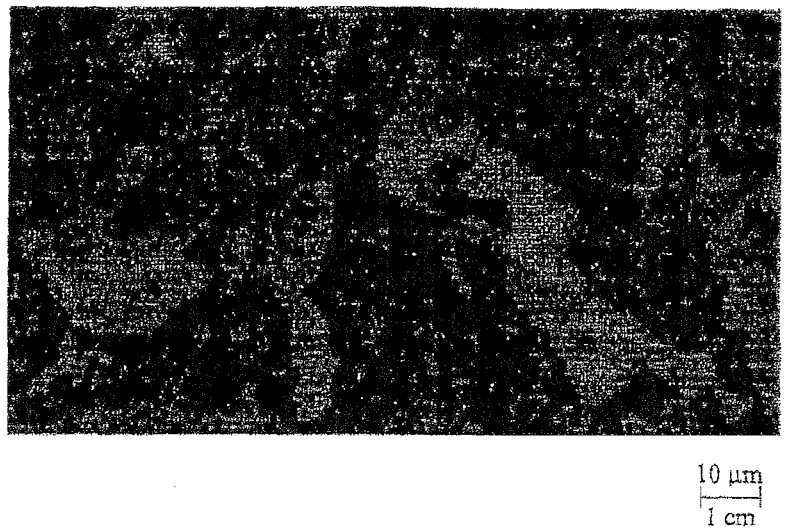
FIG. 3 is a photograph (optical microscope, $10^3$ magnification) of the intermediate composite structure obtained during step 3 of the method according to the invention, after 2 minutes of infiltration at 1460° C. of liquid silicon on a Carbone Lorraine 2020 graphite. The graphite matrix is dark gray, silicon carbide is light gray and the unreacted silicon appears white in the pores.
Figure 4:
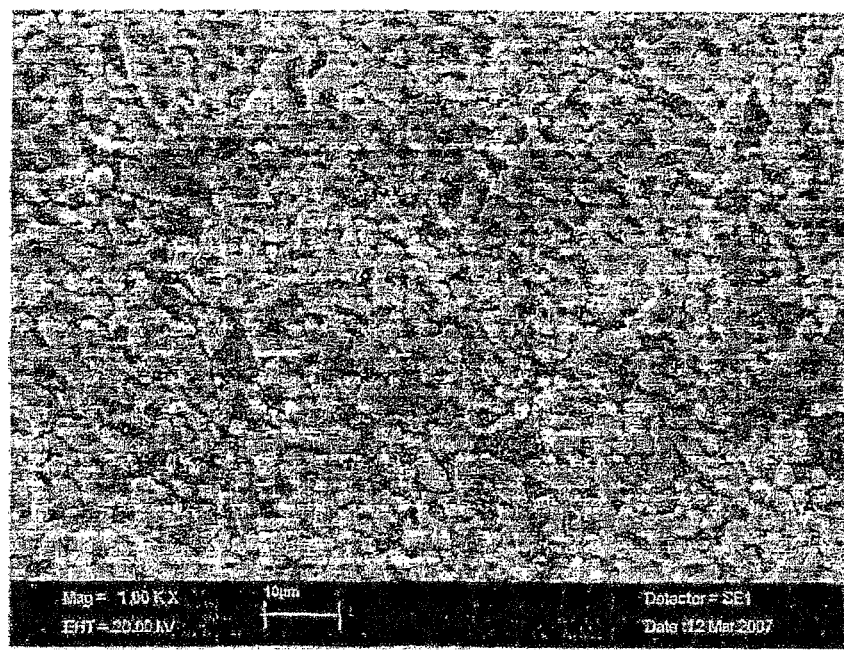

FIG. 4 is a scanning electron microscope photograph of the material obtained from a POCO AX2-5Q material following step 4 of the method according the invention. Graphite nodules appear dark gray and the SiC matrix light gray. There is no longer any unreacted silicon visible in the pores.

It should be noted that, for reasons of clarity, various layers of material with structures visible on the figures are shown in free scale and the dimensions of some parts are greatly exaggerated.

DETAILED DESCRIPTION OF A MATERIAL PART ACCORDING TO THE INVENTION

As previously stated, the material part according to the invention possesses at least one carbonaceous support layer, a layer called the surface layer formed essentially of silicon carbide, and a layer called an intermediate layer inserted between the two preceding layers and formed of a composite zone possessing an SiC structure containing at least one and preferably several graphite nodules.

The volume fraction of the SiC structure may vary from 45 to 70%. In a general manner, the volume fraction of SiC in the composite zone is equal to the volume fraction of the graphite porosity forming the original material part, namely before treatment according to the invention, multiplied by at least 1.2, preferably by at least 1.5 and more preferably by 1.8.

The thickness of the "surface" layer and the "intermediate" layer together is advantageously greater than 300 µm and preferably 500 to 2000 µm.

As regards the support layer, it is preferably carbonaceous. Within the meaning of the present invention, a base layer of a carbonaceous material appears as a material formed essentially of carbon atoms.

More precisely, the carbonaceous material is, within the meaning of the invention, a material of which the carbon atom content is greater than 95%, in particular greater than 99% by weight based on its total weight.

It consists more particularly of graphite.

This carbonaceous material possesses an open porosity.

More particularly, this open volume porosity varies from 25% to 40%, preferably 30% to 35%. This porosity may be characterized by the mercury porosimetric method.

Preferably, its structure also consists of graphite grains of micrometric size varying from 1 to 10 µm, advantageously 1 to 5 µm and preferably a few micrometers apart, in particular 1 to 10 µm and advantageously 1 to 5 µm apart.

Detailed Description of the Method According to the Invention

Advantageously, the material part to be treated according to the invention possesses a carbonaceous layer at the surface having a grain size compatible with siliconization over a millimetric depth and with a sufficient degree of reaction so that the final structure is composed of graphite nodules dispersed in a silicon carbide matrix.

Its carbonaceous structure possesses an open porosity according to that previously defined.

It is possible to use graphites with an open volumetric porosity that is less than 25%, that are subjected to oxidation treatment in order to increase this porosity over a millimetric depth. In this case, it is necessary to start with a graphite structure with sufficiently fine grains in order to ensure good mechanical strength following treatment. Graphite that is too dense may also be covered with a graphite layer with the desired porosity in order to implement the infiltration process and to obtain the desired structure of graphite nodules in a silicon carbide matrix.

On the other hand, graphites with coarse grains prove to be unsatisfactory within the context of the present invention, on account of the presence of unreacted silicon in the pores at the end of the siliconization treatment.

The material part employed in step (2) of the method according to the invention is put into contact with liquid silicon, for example by immersion in a bath of molten silicon.

Its thickness is notably greater than 1 mm.

As already previously stated, following the method according to the invention, a volume assessment taking into account the volume change associated with the reaction Si+C→SiC shows that the volume fraction of SiC in the composite is equal to the volume fraction of the initial porosity of the graphite multiplied by 1.8.

The method according to the invention thus comprises at least steps consisting of taking a material part having at least one carbonaceous layer on the surface, of putting said part into contact with liquid silicon, and of bringing it to a first temperature level favorable to the infiltration of molten silicon into the graphite until the pores are filled up.

This temperature is at least equal to the melting point of silicon.

More precisely, this level may be attained at temperatures varying between the melting point of silicon, namely approximately 1410° C., to approximately 1500° C., advantageously approximately 1410° C. to approximately 1450°.

According to the temperature chosen, the duration of this first temperature level may vary between 10 minutes and an hour, advantageously between 20 minutes and 40 minutes.

Following this third step, the material part of which the outer surface is formed of a graphite matrix containing SiC nodules and silicon over a certain depth greater than 300 μm is brought to a second temperature level.

The temperature of this second level makes it possible to homogenize the microstructure of the outer layer and in particular to complete the consumption of infiltrated silicon. This level may be established at temperatures varying between 1500° C. and 1700° C., advantageously between 1500° C. and 1600° C.

According to the temperature chosen, the duration of this second level may vary between one hour and eight hours, advantageously between three hours and six hours. In all cases, this duration is sufficient to enable the conversion of graphite to continue into a silicon carbide structure incorporating graphite nodules as well as the substantially total elimination of residual silicon.

The third and fourth steps of the method may be carried out under a variable pressure, generally at atmospheric pressure or at a lower pressure. It is however found that proceeding in a vacuum advantageously enables liquid silicon to infiltrate better during the second step by pre-siliconizing the graphite grains in the gaseous phase. Infiltration may then be achieved over a thickness of 15% to 20% greater than the thickness obtained at atmospheric pressure.

These steps are generally carried out in an inert atmosphere or in a vacuum.

The invention will now be described by means of the following example, given of course as a non-limiting illustration of the invention.

EXAMPLE 1

The grade tested was a sheet of POCO AXZ-5Q graphitic material (length 10 cm, width 10 cm, thickness 1 cm) with a volume porosity of 32% and grain size of the order of 1 μm.

The material was heated in an atmosphere of neutral gas (argon) in an induction furnace. The infiltration temperature chosen was T=1430° C., slightly above the melting point of silicon.

After a period of 30 minutes at a level T=1430° C., the material was subjected to a temperature of 1500° C. for 6 hours in order to homogenize the microstructure of the outer layer of 15-20 microns and to complete the consumption of infiltrated silicon.

The assembly was cooled to ambient temperature at a rate of 5° C./min as far as 900° C. and then by natural cooling after the heating was stopped.

The invention claimed is:

1. A material part, possessing a multilayer architecture formed of at least:
   one support layer based on carbon that possesses an open volume porosity varying from 25% to 40% and consists of graphite grains having a micrometric size of 1 to 10 μm,
   a surface layer made of silicon carbide,
   an intermediate layer inserted between said support and surface layers,
   wherein said intermediate layer is formed of a matrix of silicon carbide containing at least 30% by volume of a carbon nodule or nodules, with the volume fraction of silicon carbide forming said intermediate layer being equal to the volume fraction of the initial porosity of the graphite forming the support layer based on carbon, multiplied by at least 1.2,
   the volume fraction of silicon carbide forming the intermediate layer varying from 45% to 70%, and the surface and intermediate layers possessing less than 5% by volume of solid silicon.

2. The material part as claimed in claim 1 possessing an intermediate layer with a thickness of at least 300 μm.

3. The material part as claimed in claim 1, intended to be put into contact with liquid silicon.

4. The material part as claimed in claim 1, wherein the surface and intermediate layers possess less than 1% by volume of solid silicon.

5. The material part as claimed in claim 1, wherein the surface and intermediate layers are totally devoid of solid silicon.

6. The material part as claimed in claim 1, wherein the silicon carbide matrix forming the intermediate layer contains at least 40% by volume of a carbon nodule or nodules.

7. The material part as claimed in claim 1 possessing an intermediate layer with a thickness greater than 400 μm.

8. The material part as claimed in claim 1 possessing an intermediate layer with a thickness varying from 500 μm to 2000 μm.

9. A method for preparing a material part possessing a multilayer architecture comprising at least:
   one support layer based on carbon,
   a surface layer made of silicon carbide and
   an intermediate layer inserted between the support and surface layers wherein the intermediate layer is formed of at least one silicon carbide matrix containing at least, 30% by volume of a carbon nodule or nodules, with the volume fraction of silicon carbide forming said intermediate layer being equal to the volume fraction of the graphite porosity of the carbon-based support layer multiplied by 1.8,
   the volume fraction of silicon carbide forming the intermediate layer varying from 45% to 70%, and the surface and intermediate layers possessing less than 5% by volume of solid silicon,
   said method comprising:
   (1) making use of a material part comprising at least one external carbonaceous layer with a volume porosity varying from 25% to 40% and with graphite grains of micrometric size of 1 to 10 μm,
   (2) putting said part into contact with liquid silicon,
   (3) holding the assembly at a temperature between 1410° C. and 1500° C. favorable to the infiltration of said liquid silicon into the pores of the carbonaceous layer and to the formation of a composite zone formed of a graphite matrix incorporating SiC nodules, and
   (4) bringing the part obtained at the end of the preceding step to a temperature between 1500° C. and 1700° C. in order to form said surface and intermediate layers and to consume the essential part of residual silicon from the preceding step.

10. The method as claimed in claim 9 wherein the thickness of the surface layer and the intermediate layer together is greater than 300 μm.

11. The method as claimed in claim 9, wherein said part is kept at the temperature level of step (3) for 10 minutes to 1 hour.

12. The method as claimed in claim 9 wherein step (4) is carried out at a temperature varying from 1500° C. to 1700° C.

13. The method as claimed in claim 9 wherein said part is kept at the level of step (4) for 1 to 8 hours.

14. The method as claimed in claim 9, wherein the material part of step (1) comprises at least one external carbonaceous layer with a volume porosity varying from 30% to 35%.

15. The method as claimed in claim 9, wherein the material part of step (1) comprises at least one external carbonaceous layer extending over a thickness of at least 1000 µm.

16. The method as claimed in claim 9, wherein step (4) is carried out at a temperature varying from 1500° C. to 1600° C.

17. The method as claimed in claim 9 wherein the thickness of the surface layer and the intermediate layer together varies from 500 to 2000 µm.

18. The method as claimed in claim 9, wherein the carbonaceous layer consists of graphite grains of micrometric size varying from 1 to 5 µm.

19. The method as claimed in claim 9, wherein step (3) is carried out at a temperature varying from 1410 to 1450° C.

20. The method as claimed in claim 9 wherein said part is kept at the temperature level of step (3) for 20 minutes to 40 minutes.

21. The method as claimed in claim 9 wherein step (4) is carried out at a temperature varying from 1500° C. to 1600° C.

22. The method as claimed in claim 9, wherein said part is kept at the level of step (4) for 3 to 6 hours.

\* \* \* \* \*